United States Patent
Bouchiat et al.

(10) Patent No.: US 9,458,020 B2
(45) Date of Patent: Oct. 4, 2016

(54) PROCESS AND DEVICE FOR FORMING A GRAPHENE LAYER

(71) Applicant: CENTRE NATIONAL DE LA RECHERCHE SCIENTIFIQUE, Paris (FR)

(72) Inventors: Vincent Bouchiat, Biviers (FR); Johann Coraux, Villeurbanne (FR); Zheng Han, Grenoble (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 58 days.

(21) Appl. No.: 13/887,424

(22) Filed: May 6, 2013

(65) Prior Publication Data
US 2014/0326700 A1    Nov. 6, 2014

(51) Int. Cl.
B44C 1/22 (2006.01)
C01B 31/04 (2006.01)

(52) U.S. Cl.
CPC ........ C01B 31/0453 (2013.01); *C01B 2204/02* (2013.01); *C01B 2204/04* (2013.01); *C01B 2204/22* (2013.01)

(58) Field of Classification Search
CPC .......... C01B 2204/02; C01B 2204/04; C01B 2204/22; C01B 31/0453
USPC ............. 216/37, 75; 438/478, 610; 423/448; 427/249.1, 249.6
See application file for complete search history.

(56) References Cited

U.S. PATENT DOCUMENTS

| | | | |
|---|---|---|---|
| 2009/0110627 A1* | 4/2009 | Choi | B82Y 30/00 423/447.1 |
| 2011/0091647 A1* | 4/2011 | Colombo et al. | 427/249.1 |
| 2012/0298620 A1* | 11/2012 | Jiang et al. | 216/20 |
| 2013/0122220 A1* | 5/2013 | Won et al. | 427/595 |
| 2013/0174968 A1* | 7/2013 | Vlassiouk et al. | 156/155 |
| 2014/0014030 A1* | 1/2014 | Tour | C30B 25/186 117/97 |
| 2014/0050652 A1* | 2/2014 | Tzeng | 423/448 |
| 2014/0178688 A1* | 6/2014 | Tour | C01B 31/0453 428/408 |
| 2015/0064098 A1* | 3/2015 | Grobert | C01B 31/0461 423/448 |

OTHER PUBLICATIONS

Li, X et al, "Graphene films with large domain size by a two-step chemical vapor deposition process" Oct. 19, 2010, published via the internet.
Hu, B et al, "Epitaxial growth of large-area single-layer graphene over Cu(111)/sapphire by atmospheric pressure CVD" Aug. 6, 2011, publised via the Internet.
Han, Z et al "Suppression of Multilayer Graphene Patches during Graphene growth" May 7, 2012, published via the internet.

* cited by examiner

*Primary Examiner* — Nadine Norton
*Assistant Examiner* — Christopher Remavege
(74) *Attorney, Agent, or Firm* — Kevin R. Erdman; Brannon Sowers & Cracraft PC

(57) ABSTRACT

The invention concerns a method of forming a graphene layer involving: heating a support layer in a reaction chamber; and forming the graphene layer on a surface of the support layer by: a) during a first time period, introducing into the reaction chamber an organic compound gas to cause a formation of carbon atoms on the surface; b) during a second time period after the first time period, reducing a rate of introduction of the organic compound gas into the reaction chamber and introducing into the reaction chamber a further gas, wherein the further gas is a carbon etching gas; and repeating a) and b) one or more times.

19 Claims, 3 Drawing Sheets

PROCESS AND DEVICE FOR FORMING A GRAPHENE LAYER

BACKGROUND OF THE INVENTION

1. Field of the Invention

The present disclosure relates to a process and an apparatus for forming graphene, and in particular to a process and apparatus for forming a graphene layer by chemical vapor deposition.

2. Description of the Related Art

Graphene is a substance composed of carbon atoms forming a crystal lattice one atom in thickness. Various applications have been proposed for graphene, including its use in radio-frequency transistors and for forming transparent highly conductive and flexible electrodes, such as for displays. It is of particular benefit in applications where high mobility conductors are desired. Most applications of graphene require a macroscale-sized graphene layer, comprising one or a few layers of carbon atoms, which is transferred onto a substrate of a material selected based on the particular application.

One solution for forming such a macroscale-sized graphene layer is to use chemical vapor deposition (CVD). For example, a process based on this technique in which graphene is formed on copper foil is described in US patent application US2011/091647. One problem with this technique is that the quality of the graphene layer is heavily dependent on the quality of the copper foil.

On the one hand, use of a high quality copper foil may result in a graphene layer of reasonable quality. For example, the publication titled "Epitaxial growth of large-area single-layer graphene over Cu(111)/Sapphire by atmospheric pressure CVD", Hu et al., Carbon Vol. 50, 2012, pages 57-65, describes forming graphene on high quality copper. However, the cost of such high quality copper foil prevents the process being adopted on an industrial scale, and the lateral dimensions of the graphene sheets that can be produced are generally limited. Furthermore, it is generally not possible to reuse the copper foil, as in order to transfer of graphene layer onto another substrate, the copper foil is generally etched away.

On the other hand, when an industrial quality copper foil is used, the cost is relatively low, but the quality of the graphene layer tends to be poor, multilayer patches being a common occurrence.

SUMMARY OF THE INVENTION

It is an aim of embodiments of the present disclosure to at least partially address one or more drawbacks in the prior art.

According to one aspect, there is provided a method of forming a graphene layer comprising: heating a support layer in a reaction chamber; and forming the graphene layer on a surface of the support layer by: a) during a first time period, introducing into the reaction chamber an organic compound gas to cause a formation of carbon atoms on the surface; b) during a second time period after the first time period, reducing a rate of introduction of the organic compound gas into the reaction chamber and introducing into the reaction chamber a further gas, wherein the further gas is a carbon etching gas; and repeating a) and b) one or more times.

According to one embodiment, the method further comprises introducing the further gas into the reaction chamber during each of the first time periods.

According to one embodiment, the further gas is at least one of hydrogen and oxygen.

According to one embodiment, each of the second time periods has a duration at least one tenth of the duration of each of the first time periods, and for example a duration at least equal to the duration of each of the first time periods.

According to one embodiment, the duration of each of the first time periods and the second time periods is at least one second.

According to one embodiment, the dose of organic compound gas introduced into the reaction chamber during each of the first time periods is equal to between 0.1 and 100 Pa·s, and during each of the second time periods is less than or equal to 0.01 Pa·s.

According to one embodiment, the support layer is a copper foil.

According to one embodiment, the organic compound gas is introduced into the reaction chamber at a rate of at least 1 sccm during the first time periods and at a rate of at most 0.1 sccm during the second time periods. For example, during the second time periods, the organic compound gas is not introduced into the reaction chamber.

According to one embodiment, a) and b) are repeated throughout a growth period of the graphene layer of at least 10 seconds.

According to one embodiment, the method further comprises additionally introducing an inert gas into the reaction chamber during the first and second time periods.

According to one embodiment, the organic compound gas is at least one of: methane, butane, ethylene and acetylene.

According to one embodiment, the graphene layer has between 1 and 10 layers of carbon atoms, and for example a single layer of carbon atoms.

According to one embodiment, the rate of introduction of the organic compound gas into the reaction chamber is at a first rate during one or more of the first time periods, and at a second rate lower than the first rate during one or more of the first time periods.

According to a further aspect, there is provided an apparatus for forming a graphene layer comprising: a reaction chamber containing a support layer; at least one heating element for heating the support layer; and a control device configured to control the formation of the graphene layer on a surface of the support layer by: a) during a first time period, introducing into the reaction chamber an organic compound gas to cause a formation of carbon atoms on the surface; b) during a second time period directly after the first time period, reducing a rate of introduction of the organic compound gas into the reaction chamber and introducing into the reaction chamber a further gas, wherein the further gas is a carbon etching gas; and repeating a) and b) one or more times.

According to a further aspect, there is provided a non-transient computer readable medium storing a instructions that, when executed by a processor, controls a process of growing a graphene layer on a surface of a support layer by: a) controlling, during a first time period, the introduction into the reaction chamber of an organic compound gas to cause a formation of carbon atoms on the surface; b) controlling, during a second time period directly after the first time period, the reduction of the rate of introduction of the organic compound gas into the reaction chamber and the introduction into the reaction chamber of a further gas, wherein the further gas is a carbon etching gas; and repeating a) and b) one or more times.

BRIEF DESCRIPTION OF THE DRAWINGS

The foregoing and other features and advantages will become apparent from the following detailed description of embodiments, given by way of illustration and not limitation with reference to the accompanying drawings, in which.

Figure 1:
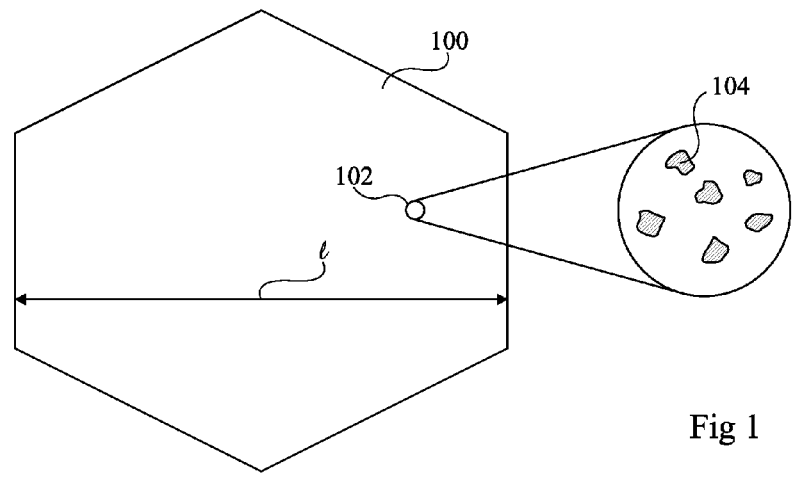
FIG. 1 illustrates a macroscale-sized graphene layer according to an example embodiment.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DESCRIPTION OF EMBODIMENTS OF THE PRESENT INVENTION

The embodiments disclosed below is/are not intended to be exhaustive or limit the invention to the precise form disclosed in the following detailed description. Rather, the embodiment is chosen and described so that others skilled in the art may utilize its teachings.

FIG. 1 illustrates in plan view an example of a macroscale-sized layer of graphene 100 formed according to a known CVD technique such as the method described in US patent application US2011/091647, the whole contents of which is hereby incorporated by reference.

The layer of graphene 100 for example has a length 1 in the region of a few millimeters, and in this example has a generally hexagonal form. The layer of graphene 100 for example has in general a thickness of one or a few carbon layers. However, as represented by a blow-up view of a zone 102 of the graphene layer 100, the graphene for example includes multilayer defects 104. In particular, these defects 104, represented by shaded patches, correspond to regions in which one or more additional layers or graphene are present. Thus rather than a homogenous graphene layer having a single layer of carbon atoms or a constant number of layers of carbons atoms, the graphene layer 100 is non-homogenous.

Such multilayer deflects are undesirable in many applications. For example, in transistor technology the non-homogenous regions can affect the mobility of charge carriers. In optical applications, the non-homogenous regions can cause optical degradation, for example absorbance fluctuations, diffraction, etc.

Figure 2:
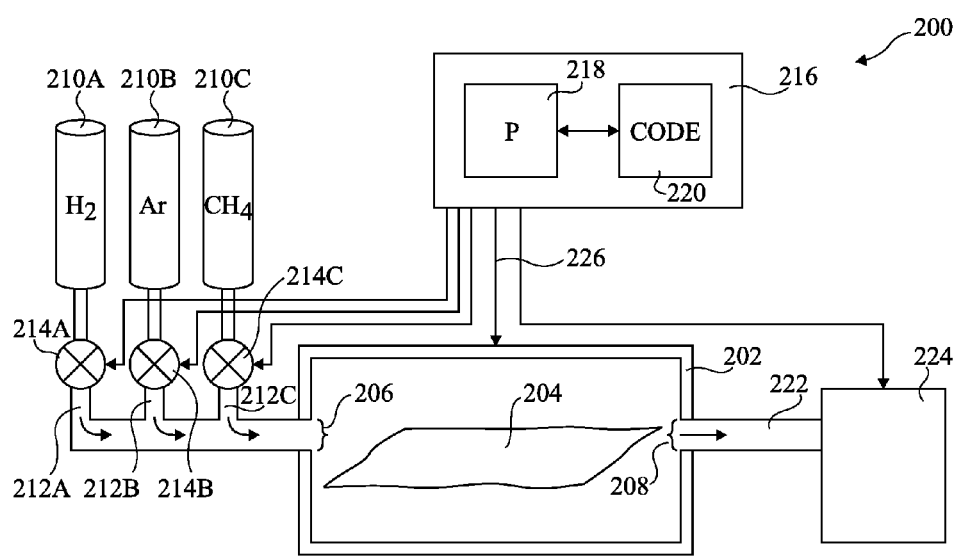
FIG. 2 schematically illustrates an apparatus for forming a graphene layer according to an example embodiment of the present disclosure.

FIG. 2 illustrates an apparatus 200 for forming a graphene layer according to an embodiment of the present disclosure.

The apparatus 200 comprises a reaction chamber 202 in which the graphene layer is formed. For example, the reaction chamber 202 is a tube furnace or other type of chamber that can be heated.

A support layer 204, for example formed of copper foil is placed within the chamber 202. The support layer 204 provides a surface suitable for graphene formation. In particular, the material of the support layer 204 is for example selected as one that provides a catalyst for graphene formation, and for example has relatively low carbon solubility. For example, other possible materials for forming the support layer 204 include copper alloys such as alloys of copper and nickel, copper and cobalt, copper and ruthenium, other metals such as cobalt, nickel or ruthenium, or dielectric materials, such as zirconium dioxide, hafnium oxide, boron nitride and aluminum oxide. In some embodiments, rather than being a foil, the support layer 204 could be a thin film formed over a substrate, for example a silicon or sapphire substrate. The support layer 204 for example has a thickness of between 0.1 and 100 microns.

An inlet 206 of the reaction chamber 202 allows gases to be introduced into the chamber, and an outlet 208 allows gases to be extracted from the chamber. The inlet 206 is for example supplied with gas by three gas reservoirs 210A, 210B and 210C, which in the example of FIG. 2 respectively store hydrogen ($H_2$), argon (Ar), and methane ($CH_4$). In alternative embodiments discussed in more detail below, different gases could be used. In particular, rather than hydrogen, a different etching gas, in other words one that is reactive with carbon, could be used, such as oxygen. Rather than argon, another inert gas could be used, such as helium. This gas is for example used to control the overall pressure in the reaction chamber 202, and could be omitted entirely in some embodiments. Rather than methane, a different organic compound gas could be used, such as butane, ethylene or acetylene.

The inlet 206 is coupled to: reservoir 210A via a tube 212A comprising a valve 214A; reservoir 210B via a tube 212B comprising a valve 214B; and reservoir 210C via a tube 212C comprising a valve 214C. The valves 214A to 214C control the flow rates of the respective gases into the chamber.

The valves 214A to 214C are for example electronically controlled by a computing device 216. The computing device 216 for example comprises a processing device 218, under the control of an instruction memory 220 storing program code for controlling at least part of the graphene formation process.

The outlet 208 is for example coupled via a tube 222 to an evacuation pump 224 for evacuating gases from the reaction chamber 202. The rate of evacuation by the pump 224 is for example also controlled by the computing device 216. As represented by an arrow 226, the computing device may also control one or more heating elements of the reaction chamber 202 to heat the interior of the chamber during the graphene formation process.

Figures 3A, 3B:
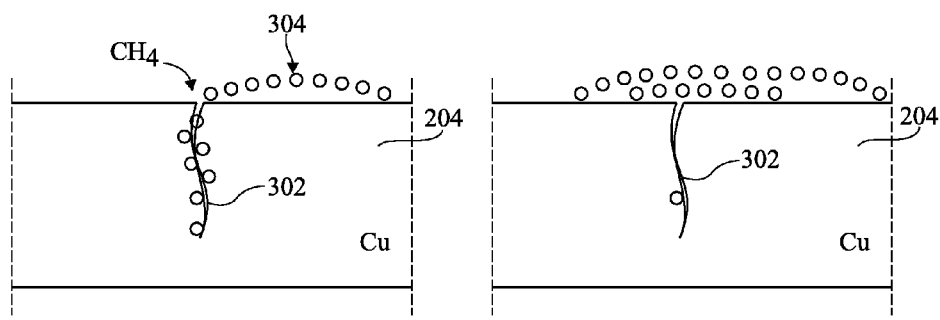
FIGS. 3A and 3B are cross-section views of a portion of a copper layer during an example of graphene formation.

FIGS. 3A and 3B are cross-section views of a portion of copper foil 204 during an example of a previous known method of graphene formation by CVD. In particular, these drawings represent an effect identified by the present inventors explaining the presence of multilayer defects in a graphene layer.

As illustrated in FIG. 3A, the copper foil 204 for example comprises a defect 302, for example at a grain boundary. This defect could also be in the form of a crack or fissure.

Graphene formation for example starts at a point 304 and extends laterally. Whereas the surface of the copper foil 204 is generally insoluble to carbon atoms, this is not true at defect 302, where a number of carbon atoms are dissolved within the copper foil.

As illustrated in FIG. 3B, when the copper foil 204 is allowed to cool at the end of the graphene formation process, the carbon atoms that were dissolved into the copper foil 204 reemerge under the layer of graphene, and form one or more additional layers of carbon atoms trapped between the surface of copper foil and the graphene layer, resulting in the multilayer defect described above. This explanation for the presence of multilayer defects is supported by the fact that, when the layer of graphene is peeled away, flakes of graphene can be observed on the surface of the copper foil, indicating that these flakes are located directly on the copper surface, and not on the upper surface of the graphene layer.

The present inventors have found that the presence of multilayer defects can be reduced or removed entirely by a pulsed CVD process, as will now be described with reference to FIGS. 4 to 6. This is also discussed in the publication "Suppression of Multilayer Graphene Patches during Graphene growth" authored by the inventors and others, the disclosures of which are submitted with this application and incorporated by reference in its entirety.

Figure 4:
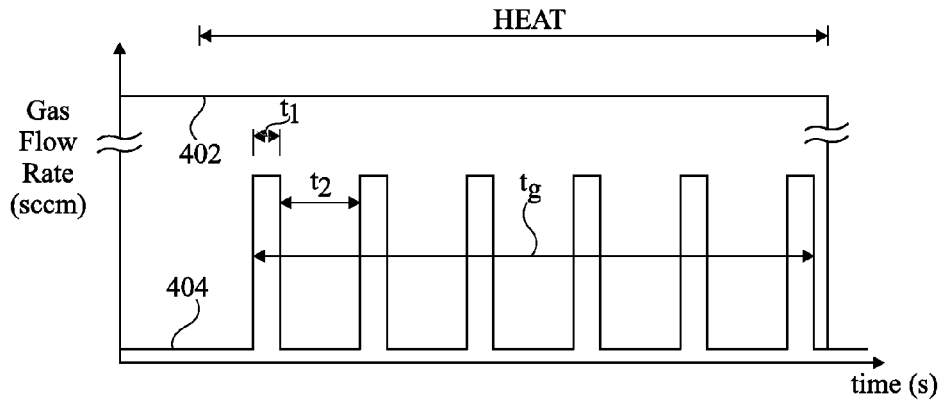
FIG. 4 is a timing diagram illustrating gas flow rates during formation of a graphene layer according to an embodiment of the present disclosure.

FIG. 4 is a timing diagram representing an example of the flow rates of the organic compound gas, such as methane, and of the carbon etching gas, such as hydrogen, during a method of graphene formation according to an example embodiment.

A line 402 in FIG. 4 represents the flow rate of the carbon etching gas, which is for example constant throughout the graphene formation process, at a rate of between 70 and 1000 sccm (standard cubic centimeters per minute).

A line 404 in FIG. 4 represents the flow rate of the organic compound gas which, prior to the start of graphene formation, is for example at zero, in other words valve 214C is closed, or at a very low rate for example of less that 0.1 sccm.

The reaction chamber 202 is heated prior to the start of graphene formation, as represented by a period HEAT indicated in FIG. 4. For example, the reaction chamber is heated to a temperature of between 400° C. and 1500° C. The maximum temperature is for example chosen to avoid melting the support layer 204 and substrate (if any). In general, the higher the temperature, the better the CVD process, as the carbon atoms present in the organic compound gas will be more readily freed. Thus, the temperature is for example of between 700° C. and 1500° C. Alternatively, in the case of lower temperatures, a plasma-enhanced CVD process could be used, or a hot filament technique, as will be known to those skilled in the art.

Once the chamber temperature has reached the desired level, graphene growth is started by introducing the organic compound gas into the reaction chamber 202 during a time period t1. The flow rate of the organic compound gas during the time period t1 is for example between 1 and 100 sccm. While the change in the flow rate of the organic compound gas is shown by vertical lines in FIG. 4, it will be apparent to those skilled in the art that in practice the rate will rise and fall progressively over a finite time period, and the time period t1 is assumed to correspond while the rate is at its top level. The duration of the time period t1 is for example at least 1 second, and at most 100 seconds. The dose of the organic compound gas supplied in the reaction chamber 202 during the time period t1 can be defined as the duration of the time period, multiplied by the pressure of the organic compound gas in the reaction chamber. For example, the pressure is in the range 0.1 to 5 Pa, and the dose is in the range 0.1 to 100 Pa·s (Pascal seconds).

As illustrated in FIG. 4, the flow rate of the organic compound gas is pulsed, such that several time periods t1 are interrupted by time periods t2 during which the flow of the organic compound gas into the reaction chamber 202 is reduced, for example to zero. For example, the time period t2 has a duration of at least 1 second, and at most 100 seconds. In one example, the duration of the time period t2 is chosen as a function of the time period t1, as is for example equal to at least one tenth of the duration of the time period t1, and at most 20 times the duration of the time period t1. In another embodiment, the time period t2 has at least the duration of the time period t1, and at most 10 times the duration of the time period t1.

During the idle periods t2, the etching gas for example continues to be introduced into the reaction chamber.

The time periods t1 and t2 for example alternate throughout a graphene growth period tg during which the graphene layer is progressively grown. The graphene layer for example becomes a continuous layer by the end of the growth period tg, while remaining entirely a monolayer. The time period tg for example has a duration of between 10 seconds and several hours, as a function of the graphene seed density, the defect density in the support layer, the catalytic activity in the support layer and/or the speed of formation.

While not illustrated in FIG. 4, throughout the graphene growth period, the inert gas, such as argon, is also introduced into the chamber, for example to control the overall pressure in the chamber.

Furthermore, while in FIG. 4 the flow rate and thus the pressure of the organic compound gas in the reaction chamber 202 is at the same level for each time period t1, in alternative embodiments this flow rate can be varied during the growth period tg. For example, the flow rate of the organic compound gas could be reduced during one or more of the time periods t1 towards the end of the growth period tg. Varying the flow rate during graphene formation permits control of the nucleation density and is for example discussed in the publication titled "Graphene Films with Large Domain Size by a Two-Step Chemical Vapor Deposition Process", X.Li et al., Nano Lett., 2010, 10 (11), pages 4328-4334, which is hereby incorporated by reference in its entirety.

The pulsed supply of the organic compound gas during the graphene formation as described above in relation to FIG. 4 has been found by the inventors to significantly reduce the presence of multilayer defects in the graphene layer, as will now be explained with reference to FIG. 5A to 5C. This is also discussed in the publication "Suppression of Multilayer Graphene Patches during Graphene growth" authored by the inventors and others, the disclosures of which are submitted with this application and incorporated by reference in its entirety.

Figure 5A:
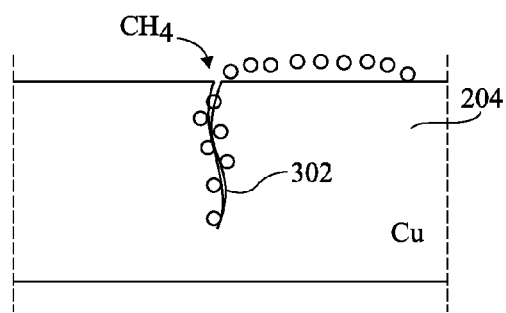
FIGS. 5A to 5C are cross-section views of a copper substrate during formation of a graphene layer according to an example embodiment of the present disclosure.
Figure 5B:
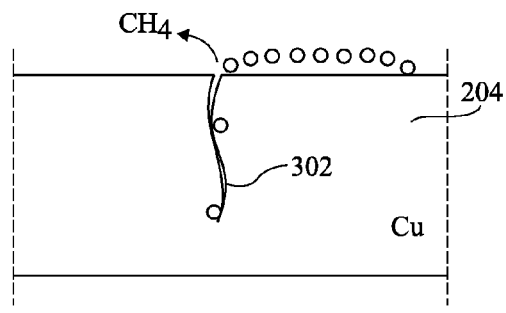
Figure 5C:
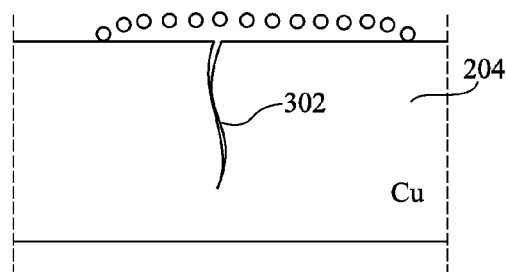

FIGS. 5A to 5C are cross-section views, according to one illustrative example, of a portion of copper foil 204 during graphene formation using the pulsed CVD process described above. These figures are based on an example using the same copper foil 204 of FIGS. 3A and 3B, comprising the same defect 302.

FIG. 5A illustrates the same starting point as shown in FIG. 3A described above, in which atoms of carbon have been dissolved in the defect 302. The view in FIG. 5A for example corresponds to the end of one of the time periods t1 of FIG. 4.

FIG. 5B illustrates a subsequent view of the carbon foil 204 during the time period t2 following the time period t1 of FIG. 5A. During the time period t2, carbon is partially etched, due to a reversal of the graphene formation process. In particular, carbon atoms recombine with atoms of the etching gas, for example hydrogen, to form volatile hydrocarbon species. This process occurs notably with carbon atoms that were dissolved within the copper foil 204 due to the defect 302. Unlike the carbon atoms present in the defects, the carbon atoms that have already formed part of the graphene layer are relatively stable and are only marginally etched away.

FIG. 5C illustrates a view during a subsequent t1 period, in which the graphene formation continues without carbon being dissolved at the point of the defect 302. Thus there are a significantly reduced number of carbon atoms trapped in the copper layer 204, reducing the present of multilayer defects in the graphene.

Figure 6:
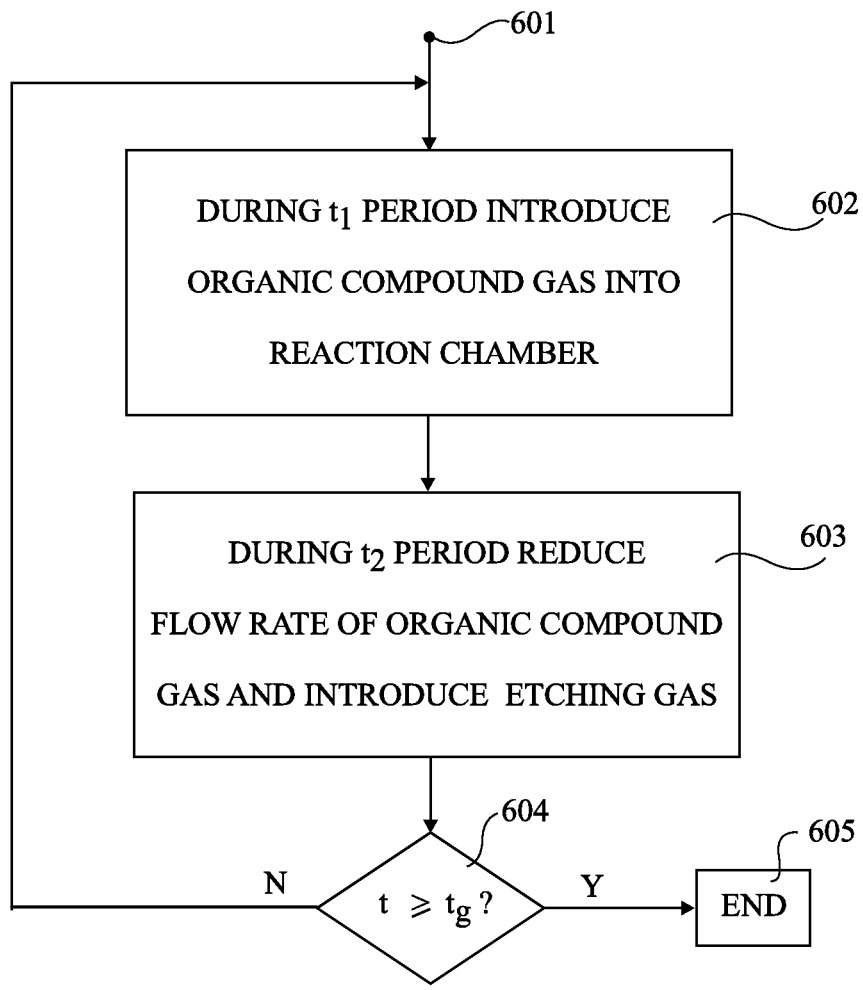
FIG. 6 is a flow diagram illustrating steps in a method of forming a graphene layer according to an example embodiment of the present disclosure.

FIG. 6 is a flow diagram illustrating an example of steps in a method of forming a graphene layer according to an example embodiment. This method is for example implemented in software by the code stored in the instruction memory 220 of FIG. 2. The method starts at a point 601.

A step 602 starts the graphene formation process, once the reaction chamber has been heated to a suitable temperature. In this step, during a first time period t1, an organic compound gas is introduced into the reaction chamber 202 to cause a formation of carbon atoms on the surface of the support layer 204.

In a subsequent step 603, during a second time period t2, which is for example directly after the first time period t1, the rate of introduction of the organic compound gas into the reaction chamber is reduced, and a further gas is introduced into the reaction chamber to partially etch the carbon. Notably, the carbon contained in the defects of the support layer and any carbon contained in graphene regions extending above a single layer will be etched.

After step 603, the next step is 604, in which it is for example verified whether the growth period tg has been reached or exceeded. If so, the method ends at step 605, and the temperature in the reaction chamber 202 is for example reduced to an ambient temperature. Alternatively, rather than the end of the method being determined by a fixed length growth period, it could be additionally or alternatively verified in step 604 whether a continuous layer of graphene has been formed over the support layer. If the growth time tg has not been reached and/or there is not yet continuous graphene growth, the method continues by repeating step 602.

In alternative embodiments, rather than determining the number of times that the periods t1 and t2 are repeated based on the overall growth period tg, the number of times the periods t1 and t2 are to be repeated could be set in advance as a parameter of the process. Furthermore, rather than ending directly after a time period t2, the process could also end directly after a time period t1.

Having thus described at least one illustrative embodiment of the invention, various alterations, modifications, and improvements will readily occur to those skilled in the art. For example, the various features described in relation to the various embodiments could be combined, in alternative embodiments, in any combination.

Such alterations, modifications, and improvements are intended to be within the spirit and scope of the invention. Accordingly, the foregoing description is by way of example only and is not intended as limiting. The invention is limited only as defined in the following claims and the equivalents thereto.

Thus, while this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of forming a graphene layer comprising:
   heating a support layer in a reaction chamber; and
   forming said graphene layer on a surface of said support layer by:
   a) during a first time period, introducing into said reaction chamber an organic compound gas to provide graphene growth by causing a formation of carbon atoms on said surface;
   b) during a second time period after said first time period, reducing a rate of introduction of said organic compound gas into said reaction chamber and introducing into said reaction chamber a further gas, wherein said further gas is a carbon etching gas; and
   repeating a) and b) one or more times.

2. The method of claim 1, further comprising introducing said further gas into said reaction chamber during each of said first time periods.

3. The method of claim 2, wherein said further gas is at least one of hydrogen and oxygen.

4. The method of claim 1, wherein each of said second time periods has a duration at least one tenth of the duration of each of said first time periods.

5. The method of claim 1, wherein each of said second time periods has a duration at least equal to the duration of each of said first time periods.

6. The method of claim 1, wherein the duration of each of said first time periods is at least one second.

7. The method of claim 1, wherein the duration of each of said second time periods is at least 1 second.

8. The method of claim 1, wherein the dose of organic compound gas introduced into said reaction chamber during each of said first time periods is equal to between 0.1 and 100 Pa·s.

9. The method of claim 1, wherein the dose of organic compound gas introduced into said reaction chamber during each of said second time periods is less than or equal to 0.01 Pa·s.

10. The method of claim 1, wherein said support layer is a copper foil.

11. The method of claim 1, wherein said organic compound gas is introduced into said reaction chamber at a rate of at least 1 sccm during said first time periods and at a rate of at most 0.1 sccm during said second time periods.

12. The method of claim 1, wherein, during said second time periods, said organic compound gas is not introduced into said reaction chamber.

13. The method of claim 1, wherein a) and b) are repeated throughout a growth period of said graphene layer of at least 10 seconds.

14. The method of claim 1, further comprising additionally introducing an inert gas into said reaction chamber during said first and second time periods.

15. The method of claim 1, wherein said organic compound gas is at least one of: methane, butane, ethylene and acetylene.

16. The method of claim 1, wherein said graphene layer has between 1 and 10 layers of carbon atoms.

17. The method of claim 1, wherein said graphene layer has a single layer of carbon atoms.

18. The method claim 1, wherein the rate of introduction of said organic compound gas into said reaction chamber is at a first rate during one or more of said first time periods, and at a second rate lower than said first rate during one or more of said first time periods.

19. A non-transient computer readable medium storing a instructions that, when executed by a processor, controls a process of growing a graphene layer on a surface of a support layer by:
   a) controlling, during a first time period, the introduction into said reaction chamber of an organic compound gas to provide graphene growth by causing a formation of carbon atoms on said surface;
   b) controlling, during a second time period directly after said first time period, the reduction of the rate of introduction of said organic compound gas into said reaction chamber and the introduction into said reaction chamber of a further gas, wherein said further gas is a carbon etching gas; and
   repeating a) and b) one or more times.

* * * * *